(12) United States Patent
Ishii et al.

(10) Patent No.: US 6,912,336 B2
(45) Date of Patent: Jun. 28, 2005

(54) OPTICAL SWITCH DEVICE

(75) Inventors: Hiromu Ishii, Kanagawa (JP); Yasuyuki Tanabe, Kanagawa (JP); Katsuyuki Machida, Kanagawa (JP); Masami Urano, Kangawa (JP); Toshishige Shimamura, Kanagawa (JP); Yuji Uenishi, Saitama (JP); Takanori Kiyokura, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 189 days.

(21) Appl. No.: 10/387,174

(22) Filed: Mar. 11, 2003

(65) Prior Publication Data

US 2003/0174934 A1 Sep. 18, 2003

(30) Foreign Application Priority Data

Mar. 15, 2002 (JP) ........................ 2002-071559
Oct. 10, 2002 (JP) ........................ 2002-297817

(51) Int. Cl.[7] .............. G02B 6/26; G02B 6/42
(52) U.S. Cl. .............. 385/18; 385/16; 385/17; 359/872; 359/877
(58) Field of Search ............ 385/16–18; 359/872, 359/877

(56) References Cited

U.S. PATENT DOCUMENTS

| 6,025,951 | A | | 2/2000 | Swart et al. ............... 359/245 |
| 6,597,827 | B1 | * | 7/2003 | Brener et al. ............... 385/18 |
| 6,600,851 | B2 | * | 7/2003 | Aksyuk et al. ............... 385/18 |
| 6,704,475 | B2 | * | 3/2004 | Jin et al. ............... 385/18 |
| 6,711,317 | B2 | * | 3/2004 | Jin et al. ............... 385/18 |
| 2002/0117728 | A1 | * | 8/2002 | Brosnihan et al. ............ 257/446 |
| 2002/0159170 | A1 | * | 10/2002 | Tsuboi et al. ............... 359/872 |
| 2003/0169962 | A1 | * | 9/2003 | Rajan et al. ............... 385/18 |
| 2004/0061961 | A1 | * | 4/2004 | Valette ............... 359/872 |
| 2004/0156581 | A1 | * | 8/2004 | Golub et al. ............... 385/18 |

FOREIGN PATENT DOCUMENTS

| EP | 0614101 | 2/1994 | .......... G02B/26/08 |
| JP | 08-122689 A | 5/1996 | |
| WO | WO 98/09279 | 3/1998 | .......... G11B/7/135 |

* cited by examiner

Primary Examiner—Akm Enayet Ullah
Assistant Examiner—Daniel Petkevsek
(74) Attorney, Agent, or Firm—Blakely Sokoloff Taylor & Zafman

(57) ABSTRACT

An optical switch device includes at least an optical switch element and driving control circuit. In the optical switch element, a fixed electrode portion is arranged, via a dielectric layer, on a semiconductor substrate on which an integrated circuit is formed. A mirror structure has a plate-shaped movable portion arranged above the fixed electrode portion while opposing the fixed electrode portion. A reflecting portion is formed at least at part of the movable portion to reflect light. A support member is fixed around the fixed electrode portion on the semiconductor substrate via a dielectric layer and supports the mirror structure. The driving control circuit is incorporated in the integrated circuit to drive the optical switch element by applying a predetermined potential to the movable portion and fixed electrode portion.

3 Claims, 9 Drawing Sheets

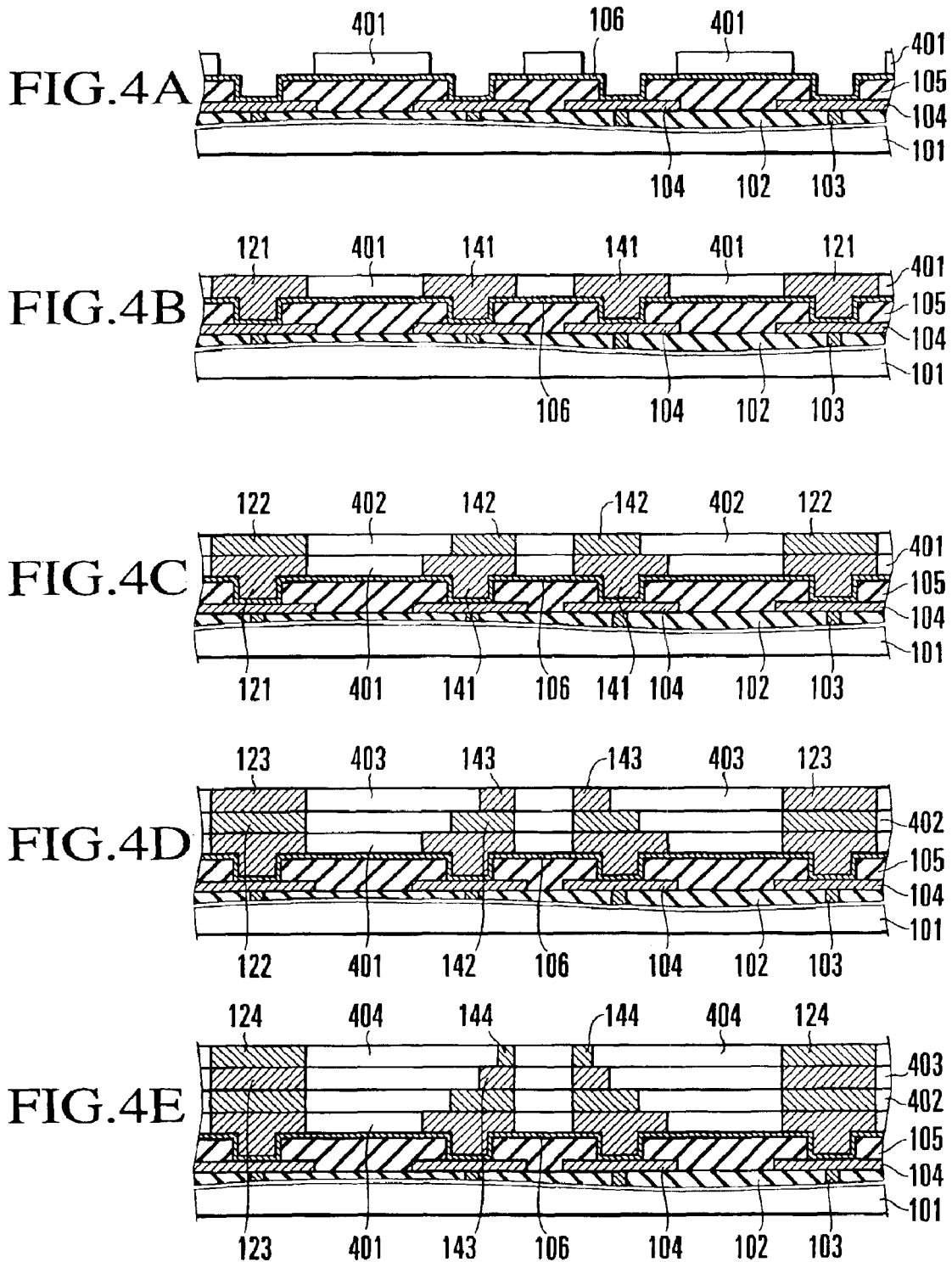

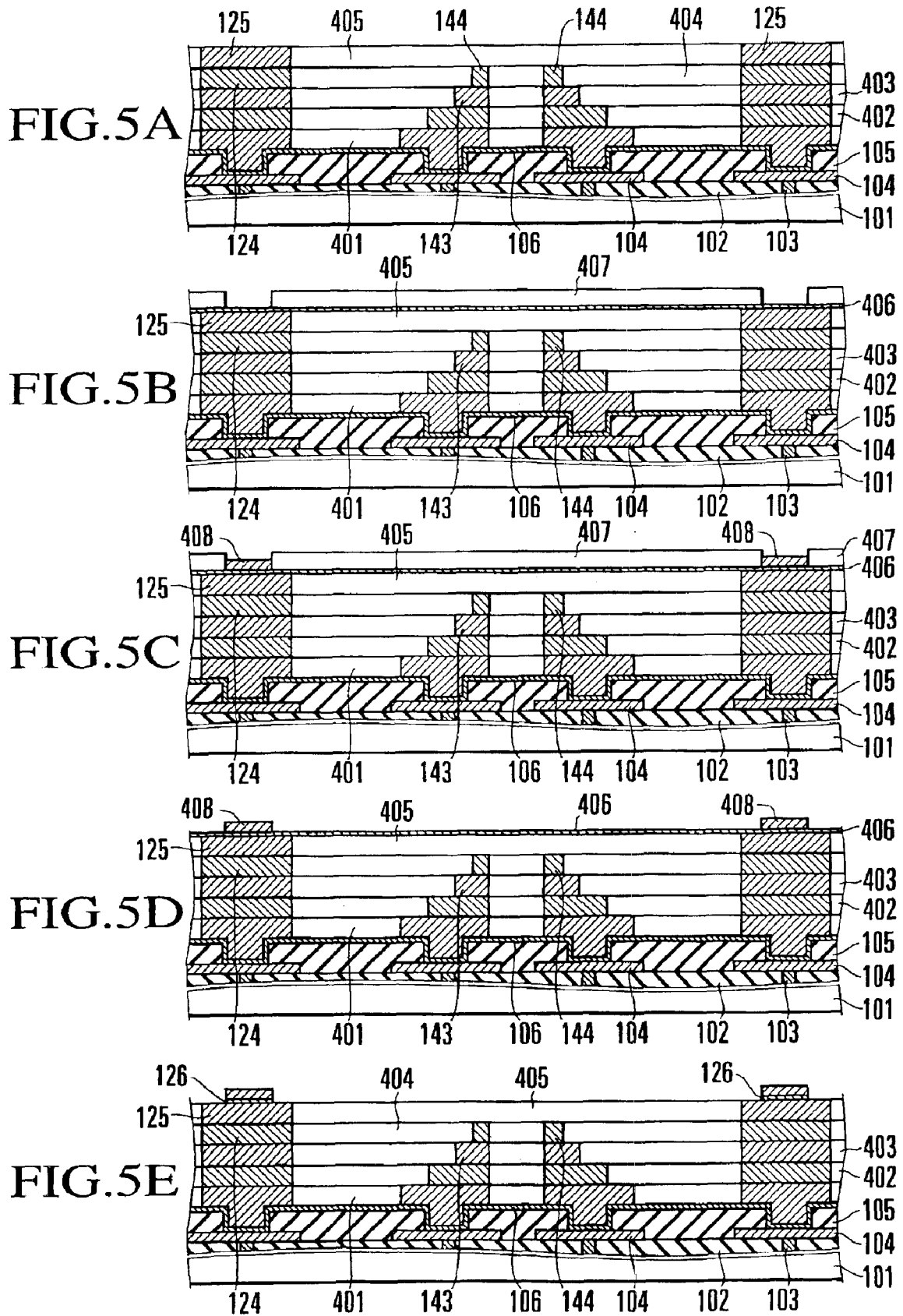

OPTICAL SWITCH DEVICE

BACKGROUND OF THE INVENTION

The present invention relates to an optical switch device which changes the path of signal light used for optical communications or the like.

Optical switch devices are components that are essential to wavelength division multiplexing (WDM) indispensable in an optical network serving as a base of, e.g., the Internet communication network. Optical switch devices of this type include optical waveguide type devices and MEMS (Micro Electro Mechanical System) type devices. Especially, the MEMS type optical switch devices having small movable reflecting surfaces are expected to be promising.

A MEMS-type optical switch device is formed from, e.g., a fixed structure and a reflecting structure having a movable mirror. The fixed structure comprises a substrate serving as a base, an electrode formed on the substrate, and the like. The reflecting structure has a support member and movable member. The movable member which acts as a mirror is separated from the fixed structure and connected to a support member through a spring member such as a torsion spring. Such a structure can be formed using the micromachine technology which implements three-dimensional micromachining by, e.g., performing etching on the basis of thin film formation or photolithography. An optical switch having the above structure performs switching operation of switching an optical path by moving the reflecting structure in accordance with the attracting force or repelling force acting between the fixed structure and the movable reflecting structure.

The above-described optical switch devices that are formed by micromachining are roughly classified into two types. One type is formed by a so-called surface micromachine. The other type is formed by a bulk micromachine.

A device of the former surface micromachine type will be described first. A surface micromachine has an arrangement as shown in FIG. 9. Referring to FIG. 9, support members 902 are pivotally arranged on a substrate 901. A frame 904 is supported by the support members 902 through hinges 903. A mirror 905 is connected to and supported by the frame 904 through a torsion spring (not shown).

Electrode portions 906 which generate an electrostatic force to drive the mirror 905 are formed under the mirror 905 and connected to interconnections (not shown). Such a structure is formed by, e.g., the steps of forming a silicon oxide film on the surface of the substrate, forming the electrode interconnection structure on the substrate, forming a polysilicon film serving as the mirror on the silicon oxide film, and etching a sacrificial film formed from a desired portion of the silicon oxide film using hydrofluoric acid or the like to separate the mirror from the substrate.

The element techniques of the surface micromachine technology are obtained from an application of the process technology for LSI. For this reason, the vertical size of a structure made by forming a thin film is limited to several $\mu$m. For an optical switch device in which the distance between the lower electrode portions 906 and the mirror 905 must be set to 10 $\mu$m or more to rotate the mirror, the sacrificial film formed from silicon oxide is removed, and simultaneously, the mirror 905 is lifted up by internal stress in the polysilicon film. Alternatively, the support members 902 are pivoted by an electrostatic force to separate the portion of the mirror 905 from the electrode portions 906.

In the bulk micromachine type, an optical switch device is generally formed by individually preparing a substrate that constructs a mirror and a substrate that constructs an electrode and connecting the substrates. Use of an SOI (Silicon On Insulator) substrate has been proposed for mirror formation. A mirror formed using an SOI substrate is formed from not polysilicon that is general for a surface micromachine but single-crystal silicon. In the structure formed from polysilicon, the mirror is warped by stress due to the polycrystal. However, in a mirror made of single-crystal silicon formed by using an SOI substrate, the warp is relatively small.

Manufacture of an optical switch using an SOI substrate will be described below with reference to FIGS. 10A to 10F. First, as shown in FIG. 10A, a trench 1001a is formed on a side (major surface) of an SOI substrate 1001, on which a buried oxide film 1002 is formed, by the known photolithography technique and etching such as DEEP RIE. With this process, a mirror 1004 is formed in a single-crystal silicon layer 1003 on the buried oxide film 1002.

At this time, a metal film such as an Au film is sometimes formed on the surface of the mirror 1004 to increase the reflectance of the mirror 1004. DEEP RIE is a technique for, e.g., dry-etching silicon, in which $SF_6$ gas and $C_4F_8$ gas are alternately supplied to repeat etching and sidewall protective film formation so that a trench or hole with an aspect ratio as high as 50 at an etching rate of several $\mu$m per min.

Next, a resist pattern having an opening in the formation region of the mirror 1004 is formed on the lower surface of the SOI substrate 1001. The silicon is selectively etched from the lower surface of the SOI substrate 1001 using an etchant such as an aqueous solution of potassium hydroxide. In this etching, the buried oxide film 1002 is used as an etching stopper layer. As shown in FIG. 10B, an opening portion 1001b is formed in the lower surface of the SOI substrate 1001 in correspondence with the formation region of the mirror 1004. Next, a region of the buried oxide film 1002, which is exposed into the opening portion 1001b, is selectively removed using hydrofluoric acid such that the mirror 1004 pivotally supported by the SOI substrate 1001 is formed, as shown in FIG. 10C.

On the other hand, a silicon substrate 1011 is selectively etched by an aqueous solution of potassium hydroxide using a predetermined mask pattern formed from a silicon nitride film or silicon oxide film as a mask. With this process, a recessed structure is formed, as shown in FIG. 10D. Then, a metal film is formed on the recessed structure by deposition or the like. The metal film is patterned by photolithography using known ultra-deep exposure and etching to form an electrode portion 1012, as shown in FIG. 10E.

Finally, the SOI substrate 1001 having the mirror 1004 shown in FIG. 10C and the silicon substrate 1011 shown in FIG. 10E are bonded to manufacture an optical switch device in which the mirror 1004 is moved by applying an electric field, as shown in FIG. 10F.

In manufacturing an optical switch by the above-described surface micromachine, however, a support structure like the support members 902 shown in FIG. 9 is formed as a movable structure in the mirror formation step. For this reason, the yield in the step of forming the support structure is lower than that in the remaining steps. This decreases the manufacturing yield of optical switch devices. In addition, since the presence of movable portions other than the mirror increases the number of movable portions, the reliability of the optical switch decreases.

Manufacturing an optical switch by bulk micromachine includes no sacrificial layer etching step for ensuring the mirror moving space, unlike the above-described manufacturing method using surface micromachine and is therefore advantageous in yield and reliability. However, the manufacturing method shown in FIGS. 10A to 10F has the following problems because the mirror moving space is mainly formed by anisotropic etching of Si using KOH solution or the like. First, to make the mirror pivotal on the SOI substrate on the mirror side, Si must be etched to a depth corresponding to almost the thickness of the substrate. At this time, the thickness of Si to be etched is at least several hundred μm.

When the lower surface of, e.g., a commercially available 6-inch SOI substrate having an Si (100) surface and a thickness of 625 μm is anisotropically etched using an alkali solution, e.g., KOH solution as an etchant, as described above, the substrate is etched and exposes the (111) surface having a tilt angle of about 55°. For example, assume that the thickness of the silicon layer on the buried oxide film is 10 μm, and the thickness of the buried oxide film is 1 μm, the thickness to be Si-etched, as shown in FIG. 10B, is 614 (=625−10−1) μm.

To ensure a 500-μm square mirror region after such Si-etching, a region having an area of about 600-μm square is removed by etching on the lower surface of the SOI substrate. Hence, to form one mirror, a large area that is not related to movement of the mirror is wastefully required. This increases the occupation area of the mirror formation portion in the chip, resulting in disadvantage in increasing the degree of integration of an optical switch device.

Additionally, in this processing method, alignment is necessary on both the upper and lower surfaces of the substrate. A complex step such as a so-called double sided aligner step (double sided exposure step) also needs to be executed. Furthermore, the substrate on the electrode portion formation side also requires etching in a depth of 10 μm or more by KOH solution to form the mirror moving space. This process is performed by anisotropic etching, like the substrate on the mirror formation side. To form the recessed structure serving as the mirror moving space, a region having an area of 10-μm square or more must be occupied first on the surface of the silicon substrate and patterned. For this reason, the degree of integration cannot be increased on the electrode side, either.

Even when a control circuit such as an IC or LSI formed by a planar process should be integrated with the optical switch device, it is very difficult in the above-described electrode substrate forming method started with anisotropic etching to form an IC or LSI necessary for mirror control on the electrode substrate side in advance or form a multilevel interconnection structure. For this reason, in the above-described manufacturing method, formation of a highly integrated element for control or formation of a complex control system which requires a number of electrode interconnections per mirror can hardly be achieved. In the above-described optical switch manufacturing method, the optical switch structure itself can be made compact. However, since an external control circuit is necessary, a device serving as, e.g., an optical switch device having desired performance becomes bulky.

SUMMARY OF THE INVENTION

It is therefore a principal object of the present invention to manufacture an optical switch device which has a mirror element formed on a semiconductor substrate having an integrated circuit including a driving control circuit and the like more easily than before while suppressing any decrease in degree of integration or yield.

In order to achieve the above object, according to an aspect of the present invention, there is provided an optical switch device comprising at least an optical switch element constituted by a fixed electrode portion arranged, via a dielectric layer, on a semiconductor substrate on which an integrated circuit is formed, a mirror structure having a plate-shaped movable portion arranged above the fixed electrode portion while opposing the fixed electrode portion, a reflecting portion which is formed at least at part of the movable portion to reflect light, and a support member which is fixed around the fixed electrode portion on the semiconductor substrate via a dielectric layer and supports the mirror structure, and a driving control circuit which is incorporated in the integrated circuit to drive the optical switch element by applying a predetermined potential to the movable portion and the fixed electrode portion.

With this arrangement, on the semiconductor substrate on which the integrated circuit is formed, the movable portion which has a reflecting portion supported by a frame portion and pivots is arranged on the fixed electrode through the support member as the fixed structure while forming a space on the fixed electrode.

BRIEF DESCRIPTION OF THE DRAWINGS

FIGS. 4A to 4E are sectional views showing, following FIG. 3C, steps in manufacturing the optical switch;

FIGS. 5A to 5E are sectional views showing, following FIG. 4E, steps in manufacturing the optical switch;

DESCRIPTION OF THE PREFERRED EMBODIMENTS

The embodiments of the present invention will be described below in detail with reference to the accompanying drawings.

Figure 1A:
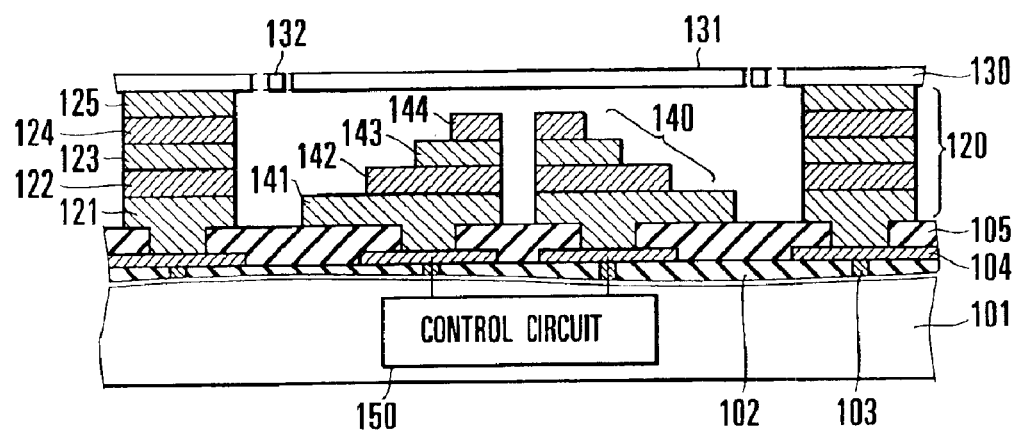
FIG. 1A is a sectional view showing the schematic arrangement of a switch element which constitutes an optical switch device according to the present invention.
Figure 1B:
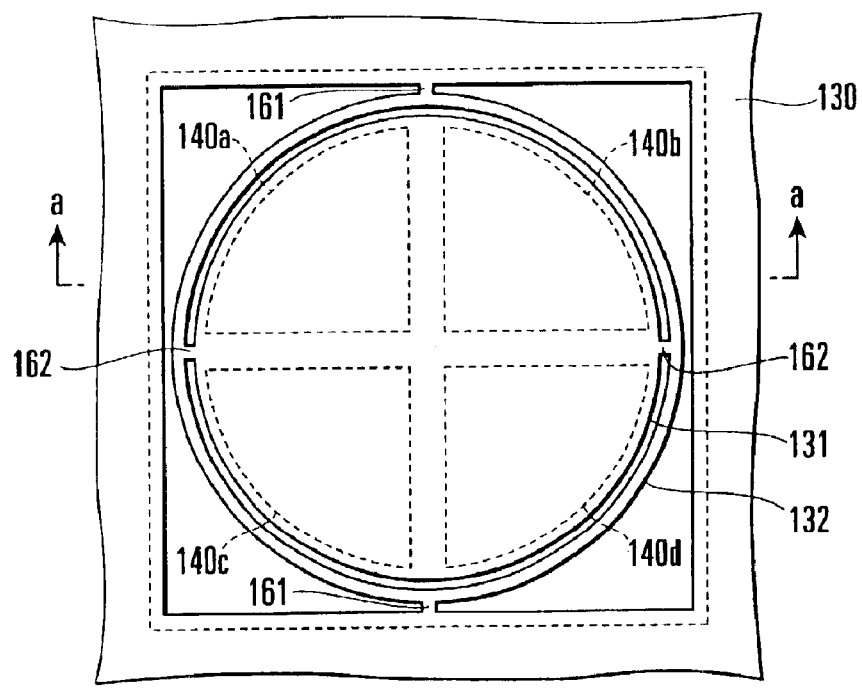
FIG. 1B is a plan view showing the schematic arrangement of the switch element which constitutes the optical switch device according to the present invention.
Figure 1C:
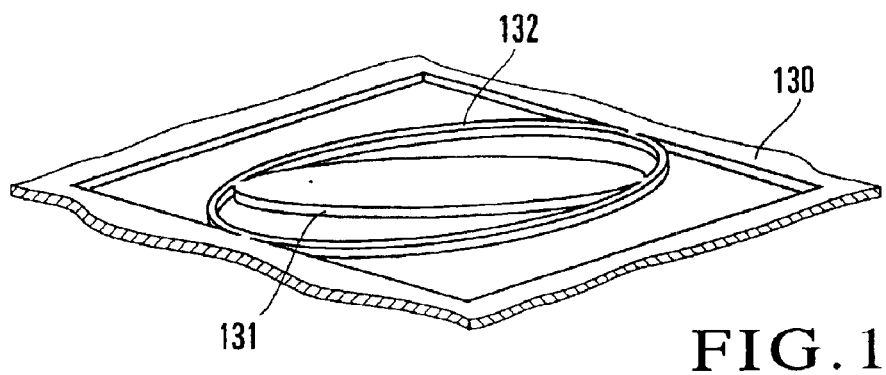
FIG. 1C is a perspective view schematically showing part of the switch element which constitutes the optical switch device according to the present invention.

FIGS. 1A to 1C show the arrangement of an optical switch device according to an embodiment of the present invention. FIG. 1A mainly partially shows a constituent unit of the optical switch device, i.e., a switch element having one mirror.

The arrangement of the optical switch device will be described. The optical switch device has a semiconductor substrate 101 formed from, e.g., silicon. An integrated circuit (not shown) constituted by a plurality of elements is formed on the semiconductor substrate 101. An interlayer dielectric layer 102 is formed on the integrated circuit. An interconnection layer 104 and interlayer dielectric layer 105 are formed on the interlayer dielectric layer 102. A support member 120 is fixed on the semiconductor substrate 101 through the dielectric films 102 and 105. The support member 120 supports a mirror structure.

In this embodiment, the support member 120 is made of a conductive material such as gold and electrically connected, through a through hole formed in the interlayer dielectric layer 105, to the predetermined interconnection layer 104 formed on the interlayer dielectric layer 102. The support member 120 is a multilayered structure formed from a metal pattern (first structure) 121, metal pattern 122, metal pattern 123, metal pattern 124, and metal pattern 125.

The mirror structure is constituted by a plate-shaped frame portion 130 fixed to the support member 120, and a plate-shaped movable portion supported inside the frame portion 130 while separated from the semiconductor substrate 101. In this embodiment, the movable portion is formed from a movable frame 132 supported inside the frame portion 130 through a pair of connection portions 161, and a mirror portion 131 supported inside the movable frame 132 through a pair of connection portions 162. The mirror portion 131 is, e.g., a circular plate having a diameter of about 500 μm. A reflecting surface is formed on the upper surface in the drawing surface of FIG. 1A. Note that the reflecting surface may be formed at part of the mirror portion 131.

In addition, the mirror structure formed from the frame portion 130, movable frame 132, and mirror portion 131 is made of a conductive material such as gold. Hence, in this embodiment, the mirror portion 131 also serves as a movable electrode electrically connected to the above-described interconnection layer through the support member 120. Note that the mirror structure may be made of a dielectric material, and a metal film may be formed on the surface of the mirror structure to form a movable electrode on the mirror portion.

The mirror structure will now be described in more detail. The movable frame 132 is suspended on and axially attached to the frame portion 130 through the pair of connection portions 161 which are formed at two portions on a predetermined pivotal axis passing through the center of the opening region of the frame portion 130 and act like torsion springs so that the movable frame 132 can pivot about the pivotal axis. The mirror portion 131 is suspended on and axially attached to the movable frame 132 through the pair of connection portions 162 which are formed at two portions on an orthogonal pivotal axis perpendicular to the above pivotal axis and passing through the center of the opening region of the frame portion 130 and act like torsion springs so that the mirror portion 131 can pivot about the orthogonal pivotal axis.

Hence, the mirror portion 131 can perform biaxial operation. When four control electrode portions 140 are arranged, and the mirror portion 131 capable of biaxial operation is formed, the mirror portion 131 can be pivoted, as shown in, e.g., FIG. 1C. FIG. 1C shows a state wherein the movable frame 132 is pivoted by about 10°, and the mirror portion 131 is pivoted by about 10°.

On the other hand, the control electrode portion (fixed electrode portion) 140 which controls the pivotal operation of the mirror portion 131 is formed on the semiconductor substrate 101 under the mirror portion 131 via the dielectric layers 102 and 105.

In this embodiment, the control electrode portion 140 is made of a conductive material such as gold and electrically connected to the predetermined interconnection layer 104 formed on the interlayer dielectric layer 102, via through holes formed in the interlayer dielectric layer 105. The control electrode portion 140 also has a multilayered structure constituted by stacking metal patterns 141, 142, 143, and 144.

The metal pattern 141 of the control electrode portion 140 has the same thickness as that of the metal pattern 121 of the support member 120. The metal pattern 142 has the same thickness as that of the metal pattern 122. The metal pattern 143 has the same thickness as that of the metal pattern 123. The metal pattern 144 has the same thickness as that of the metal pattern 124. Hence, the control electrode portion 140 is formed to be lower than the support member 120 by the thickness of the metal pattern 125.

The support member 120 may have a two-layered structure, i.e., it may be formed from two metal patterns, and the control electrode portion 140 may be formed from a metal pattern having the same thickness as that of the lower metal pattern of the support member 120. Alternatively, the support member 120 may have a three-layered structure while the control electrode portion 140 may have a two-layered structure. That is, it is only necessary that the number of layers of the control electrode portion 140 is smaller than that of the support member 120 by at least one.

In this embodiment, a lower-side metal pattern has a larger area in the control electrode portion 140. In addition, the metal patterns of the control electrode portion 140 are three-dimensionally stacked such that the control electrode portion is tapered, upward, i.e., toward the mirror structure, to the central portion of the mirror portion 131. When the control electrode portion 140 has a three-dimensional structure (three-dimensional electrode structure), a large moving space can be ensured for the mirror portion 131. The uppermost end of the control electrode portion 140 is arranged closer to the mirror portion 131. For this reason, when a control potential is applied to the control electrode portion 140, a stronger electrostatic force acts on the mirror portion 131. On the other hand, since the control electrode portion 140 separates from the mirror portion 131 at the peripheral portion of the mirror portion 131, the mirror portion 131 can largely pivot. Assume that the control electrode portion has a two-dimensional structure, and the distance between the control electrode portion and the mirror portion 131 is uniform in the initial state. When the distance between the control electrode portion and the mirror portion 131 is small, a large electrostatic force acts, though the pivotal range of the mirror portion 131 becomes small. When the control electrode portion has a two-dimensional structure, and the distance between the control electrode portion and the mirror portion 131 is increased, the pivotal range of the mirror portion 131 becomes large, though the electrostatic force becomes small. To the contrary, according to the optical switch device shown in FIGS. 1A, 1B, and 1C, since the control electrode portion 140 has a three-dimensional structure, the above-described problems are solved. The mirror portion 131 can be pivoted in a wider range while considerably decreasing the control potential necessary for pivoting the mirror portion 131.

The control electrode portion (fixed electrode portion) 140 is formed from four control electrodes 140a, 140b, 140c, and 140d, as shown in FIG. 1B. The control electrodes 140a and 140c and the control electrodes 140b and 140d are arranged symmetrically with respect to the pivotal axis that passes through the pair of connection portions 161. The control electrodes 140a and 140b and the control electrodes 140c and 140d are arranged symmetrically with respect to the pivotal axis that passes through the pair of connection portions 162. The control electrodes 140a, 140b, 140c, and 140d are arranged symmetrical with respect to the normal to the surface of the semiconductor substrate 101, which passes through the center of the mirror portion 131.

When the plurality of control electrode portions are arranged, the posture of the mirror portion 131 can be more finely controlled. In this embodiment, the control electrode portion 140 (control electrodes 140a, 140b, 140c, and 140d) has a multilayered structure. However, the present invention is not limited to this. The control electrode portion may have an integrally formed three-dimensional electrode structure. In this case, one side portion of the control electrode portion is formed from a moderately inclined surface without any step.

The arrangement will be summarized. The control electrode portion 140 is formed from a plurality of control electrodes arranged symmetrically with respect to the normal to the surface of the semiconductor substrate 101, which passes through the center of the mirror portion 131. As for the side surface of each control electrode on the opposite side of the normal, the distance between the side surface and the plane on which the mirror structure is decreased as the side surface becomes closer to the normal.

In the optical switch device of this embodiment, a control circuit 150 is formed as part of an integrated circuit (not shown) formed on the semiconductor substrate 101. The control circuit 150, e.g., generates a predetermined potential difference between the mirror portion 131 as a movable electrode and any one of the control electrodes of the control electrode portion 140 as a fixed structure to induce charges to the selected control electrode and the mirror portion (movable electrode) 131. The control circuit 150 thus causes a Coulomb force (electrostatic force) to act on the charges to move the mirror portion 131.

The mirror portion 131 stands still at a position where the torque about the pivotal axis by the electrostatic force acting on the induced charges balances with a reverse torque generated in the connection portions 161 and 162 when the movable portion rotates. The control circuit 150 cancels the potential difference between the control electrode and the mirror portion 131 and removes the charges generated in the mirror portion 131, thereby canceling the movable state of the mirror portion 131.

In this embodiment, as shown in FIG. 1B, the support member 120 is a frame-shaped structure which surrounds the space where the control electrode portion 140 is formed. However, the present invention is not limited to this. The support member 120 only needs to support predetermined portions of the frame portion 130 of the mirror structure. For example, in FIG. 1B, the support member may be separated downward from the frame portion 130 at the four corners of the space.

Figure 2:
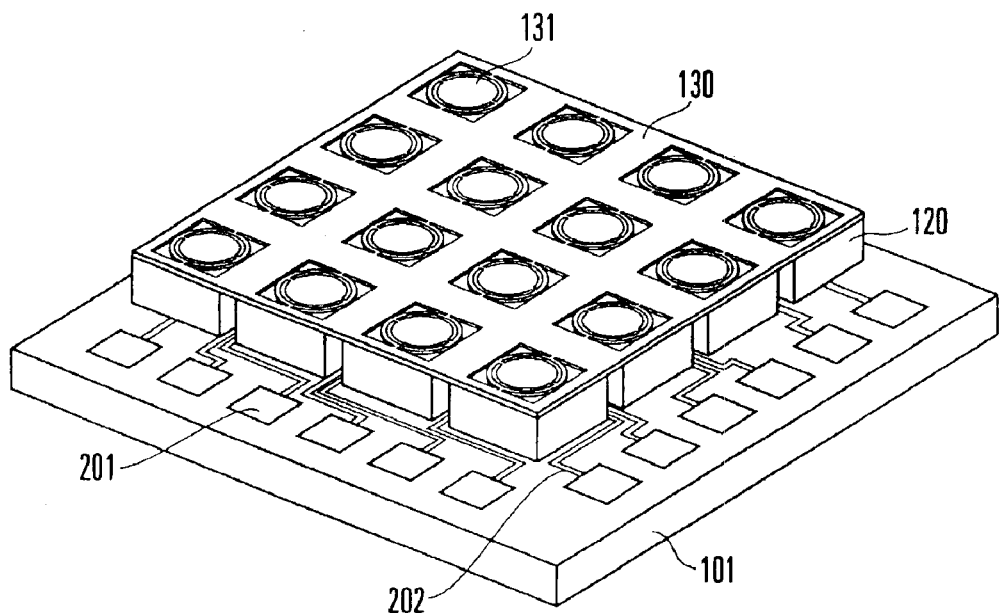
FIG. 2 is a perspective view showing the schematic arrangement of the optical switch device according to an embodiment of the present invention.

As described above, according to this embodiment, an optical switch device in which a mirror element is integrally formed on a semiconductor substrate on which an integrated circuit including a driving control circuit is formed can be manufactured more easily than before. FIG. 2 shows an example of an optical switch device formed by arranging switch elements shown in FIG. 1A in a matrix on, e.g., one plane of a semiconductor substrate.

Figure 3A:
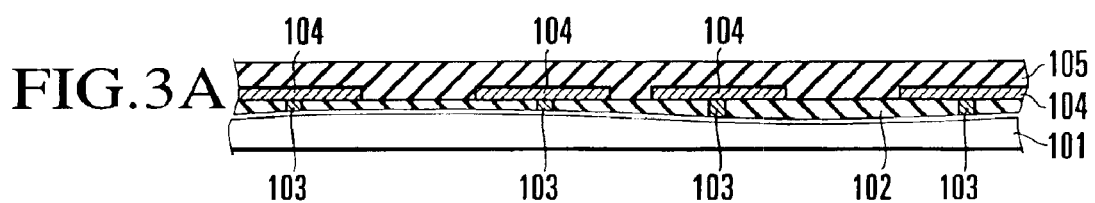
FIGS. 3A, 3B, and 3C are sectional views for explaining a method of manufacturing the optical switch according to the embodiment of the present invention.

A method of manufacturing the optical switch device according to this embodiment will be described below. First, as shown in FIG. 3A, an active circuit (not shown) which constitutes the above-described control circuit and the like is formed on the semiconductor substrate 101 made of a semiconductor such as silicon. Then, the interlayer dielectric layer 102 formed from silicon oxide is formed. Vias are formed in the interlayer dielectric layer 102. Then, the interconnection layer 104 to be connected to the underlying interconnection through the vias and connection electrodes 103 is formed on the interlayer dielectric layer 102.

These structures can be formed by known photolithography and etching. For example, the active circuit can be formed by the CMOS LSI process. The connection electrode 103 and interconnection layer 104 can be formed by forming a metal film made of Au/Ti and processing it. The lower Ti layer of the metal film has a thickness of about 0.1 $\mu$m, and the upper Au layer has a thickness of about 0.3 $\mu$m.

The metal film can be formed in the following way. An Au/Ti film is formed on the silicon oxide film by sputtering or deposition. A predetermined pattern is formed by photolithography. At this time, a resist pattern to be used to form electrode interconnections, connection portions to be used to bond a mirror substrate (to be described later), and a wire bonding pad is simultaneously formed. The Au/Ti film is selectively removed by wet etching using the resist pattern as a mask. When the resist pattern is removed, the interconnection layer 104 can be formed. The electrode interconnections, the connection portions to be used to bond a mirror substrate (to be described later), and the wire bonding pad (not shown) are formed in the interconnection layer 104.

After formation of these layers, the interlayer dielectric layer 105 which covers the interconnection layer 104 is formed. The interlayer dielectric layer 105 can be made of, e.g., a polyimide film formed to a thickness of several $\mu$m by coating polybenzoxazole as a photosensitive polymer. The interlayer dielectric layer 105 may be formed from another dielectric material.

Figure 3B:
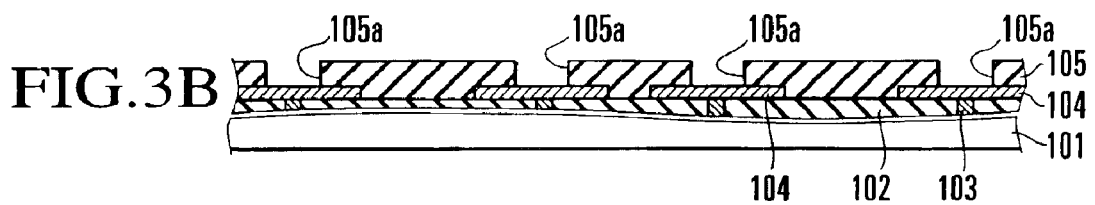

As shown in FIG. 3B, opening portions 105a to which predetermined portions of the interconnection layer 104 are exposed are formed in the interlayer dielectric layer 105. When the interlayer dielectric layer 105 is made of a photosensitive polymer, as described above, exposure/development is performed to form a pattern such that openings are formed in regions where the opening portions 105a should be formed. After the pattern is formed, the structure is annealed to harden the film, thereby forming the interlayer dielectric layer 105 having the opening portions 105a.

Figure 3C:
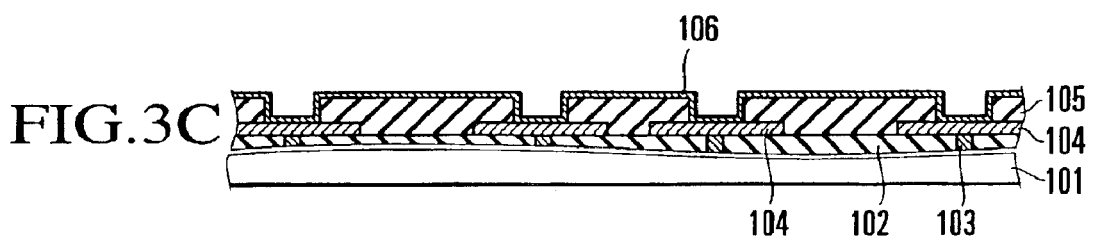

As shown in FIG. 3C, a seed layer 106 which covers the interlayer dielectric layer 105, including the inner surfaces of the opening portions 105a, is formed. The seed layer 106 is formed from a metal film made of, e.g., Ti/Cu/Ti. The thickness is about 0.1 $\mu$m for both of the Ti and Cu films.

As shown in FIG. 4A, a sacrificial pattern 401 having a thickness of about 17 $\mu$m at the flat portion is formed. The sacrificial pattern 401 can be formed by, e.g., processing a film made of polybenzoxazole as a photosensitive polymer using photolithography.

For example, first, polybenzoxazole is coated to form a polyimide film. The polyimide film is exposed using a contact aligner using a photomask or a stepper using a reticle to form photosensitive portions having a predetermined pattern. The photosensitive portions include a region where a portion to form a mirror electrode pattern, connection portions to be used to connect a mirror substrate, or a wire bonding pad is to be formed. Next, the polyimide film having the photosensitive portions is formed, and the photosensitive portions are dissolved in a developer, thereby forming the sacrificial pattern 401 having desired opening regions.

Next, as shown in FIG. 4B, the metal patterns 121 and 141 made of Cu are formed by electroplating on the seed layer 106 exposed into the opening portions of the sacrificial pattern 401 so as to have the same thickness as that of the sacrificial pattern 401. At this time, the surfaces of the metal patterns 121 and 141 are formed to be almost flush with the surface of the sacrificial pattern 401.

As shown in FIG. 4C, in accordance with the same procedure as described above, a sacrificial pattern 402 which has a desired opening pattern and a thickness of about 17 $\mu$m at the flat portion is formed, and the metal patterns 122 and 142 made of Cu are formed by electroplating on the metal patterns 121 and 141 exposed into the opening portions of the sacrificial pattern 402 so as to have the same thickness as that of the sacrificial pattern 402. At this time, each metal pattern 122 is formed to have the same size as that of the underlying metal pattern 121. Each metal pattern 142 is formed to be smaller than the underlying metal pattern 141 while making the interval between the adjacent metal patterns 142 equal to that between the adjacent metal patterns 141.

As shown in FIG. 4D, in accordance with the same procedure as described above, a sacrificial pattern 403 which has a thickness of about 17 $\mu$m at the flat portion is formed, and the metal patterns 123 and 143 made of Cu are formed by electroplating on the metal patterns 122 and 142 exposed into the opening portions of the sacrificial pattern 403 so as to have the same thickness as that of the sacrificial pattern 403. At this time, each metal pattern 123 is formed to have the same size as that of the underlying metal pattern 122. Each metal pattern 143 is formed to be smaller than the underlying metal pattern 142 while making the interval between the adjacent metal patterns 143 equal to that between the adjacent metal patterns 141.

As shown in FIG. 4E, in accordance with the same procedure as described above, a sacrificial pattern 404 which has a thickness of about 17 $\mu$m at the flat portion is formed, and the metal patterns 124 and 144 made of Cu are formed by electroplating on the metal patterns 123 and 143 exposed into the opening portions of the sacrificial pattern 404 so as to have the same thickness as that of the sacrificial pattern 404. At this time, each metal pattern 124 is formed to have the same size as that of the underlying metal pattern 123. Each metal pattern 144 is formed to be smaller than the underlying metal pattern 143 while making the interval between the adjacent metal patterns 144 equal to that between the adjacent metal patterns 141.

As shown in FIG. 5A, in accordance with the same procedure as described above, a sacrificial pattern 405 which has a thickness of about 17 $\mu$m at the flat portion is formed, and the metal patterns 125 made of Cu are formed by electroplating on the metal patterns 124 exposed into the opening portions of the sacrificial pattern 405 so as to have the same thickness as that of the sacrificial pattern 405. At this time, each metal pattern 125 is formed to have the same size as that of the underlying metal pattern 124. No opening portions are formed in the sacrificial pattern 405 on the metal patterns 144. Instead, the metal patterns 144 are covered with the sacrificial pattern 405.

As shown in FIG. 5B, a seed layer 406 formed from a metal film made of Au/Ti is formed on the surface of the sacrificial pattern 405 including the surfaces of the metal patterns 125. The seed layer 406 is formed from, e.g., a 0.1-$\mu$m thick Ti layer and a 0.1-$\mu$m thick Au layer formed on the Ti layer. After the seed layer 406 is formed, a resist pattern 407 partially having opening portions above the metal patterns 125 is formed.

As shown in FIG. 5C, metal films 408 made of Au and having a thickness of about 1 $\mu$m are formed by electroplating on the seed layer 406 exposed into the opening portions of the resist pattern 407. As shown in FIG. 5D, after the resist pattern 407 is removed, the seed layer 406 is etched by wet etching using the metal films 408 as a mask, thereby forming metal patterns 126, as shown in FIG. 5E.

Figure 6A:
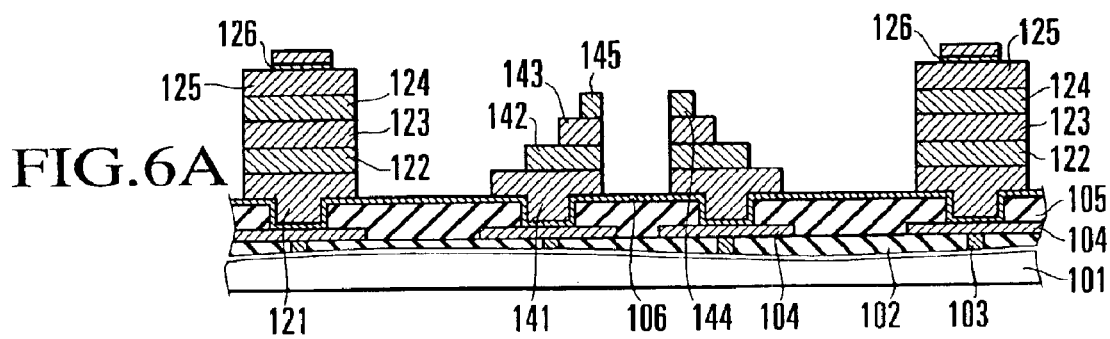
FIGS. 6A, 6B, and 6C are sectional views showing, following FIG. 5E, steps in manufacturing the optical switch.

Next, as shown in FIG. 6A, the sacrificial patterns 401, 402, 403, 404, and 405 are removed by ashing using, e.g., an ozone asher. As shown in FIG. 6A, structures constituted by the metal patterns 121, 122, 123, 124, 125 and the metal pattern 126 and structures constituted by the metal patterns 141, 142, 143, and 144 are formed. Spaces are formed between these structures.

Figure 6B:
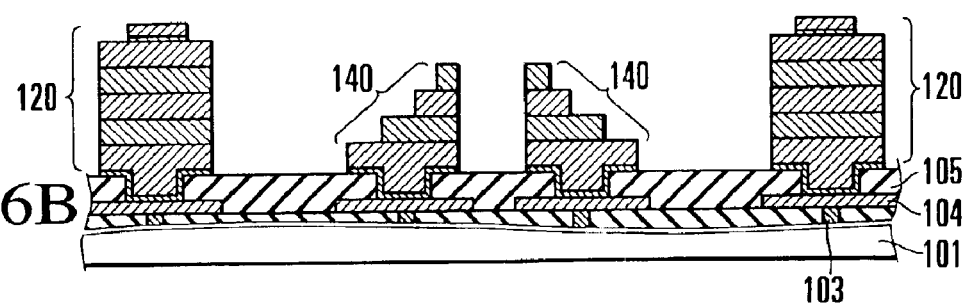

After that, the seed layer 106 is selectively removed by wet etching using the metal patterns 121 and 141, and the like as a mask to form the support member 120 and control electrode portion 140, as shown in FIG. 6B. In the control electrode portion 140, the adjacent metal patterns 141, 142, 143, and 144 have the same interval therebetween. The size of the metal pattern decreases to the upper side, i.e., toward the mirror structure to be formed in the subsequent steps. As a result, the control electrode portion 140 is tapered toward the central portion of the mirror portion 131.

Figure 6C:
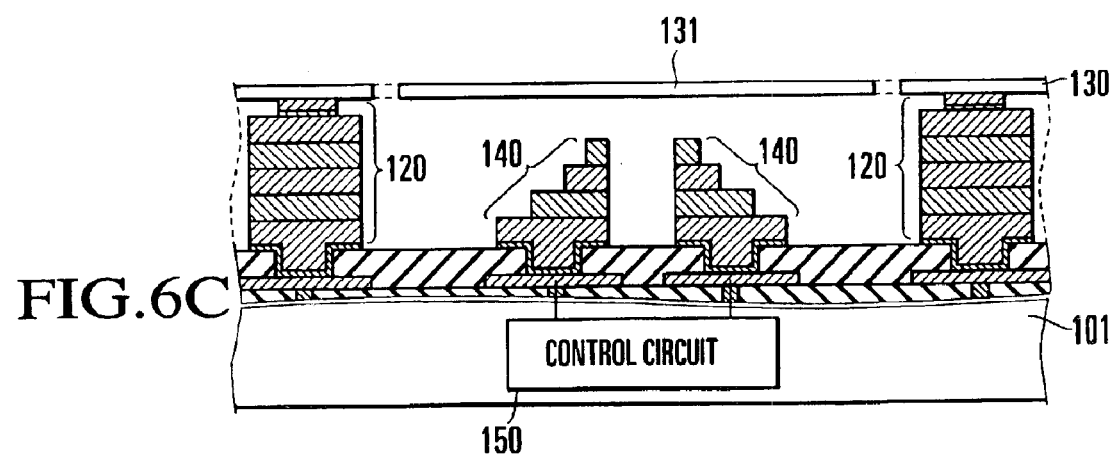

After that, the frame portion 130 to which the mirror portion 131 is pivotally connected through connection portions (not shown) is connected and fixed onto the support member 120, thus forming the optical switch device, as shown in FIG. 6C. The frame portion 130 is connected and fixed to the support member 120 by bonding and fixing the frame portion using, e.g., solder or anisotropic conductive adhesive.

According to the above-described manufacturing method, an active circuit (integrated circuit) for driving and controlling the mirror is formed on the lower electrode substrate first. Then, the control electrode portion and fixed support member are formed, as described above. A mirror substrate is connected onto the support member to manufacture an optical switch device. In the above-described method, the control electrode portion or support member is formed by stacking metal (conductive) patterns. As a result, according to this embodiment, the optical switch device can be made compact, and a high-performance optical switch device can be obtained.

Figure 7A:
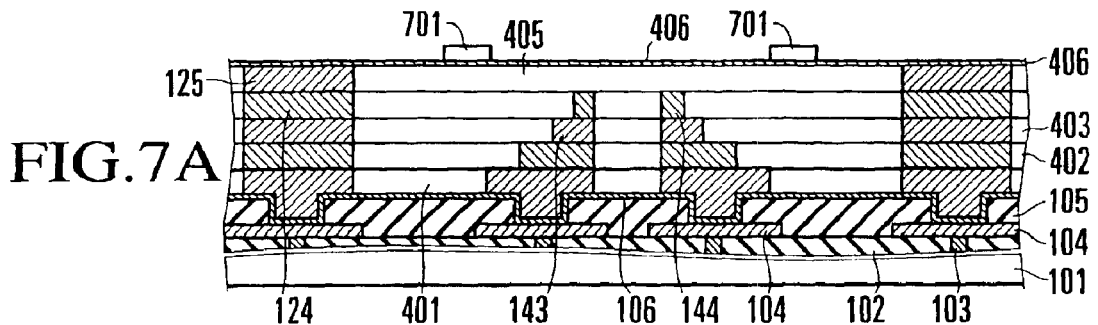
FIGS. 7A to 7D are sectional views for explaining another method of manufacturing the optical switch device.

Another manufacturing method will be described next. This manufacturing method employs the same steps as those described with reference to FIGS. 3A to 5A in the above manufacturing method, and a description thereof will be omitted. In this manufacturing method, the metal patterns 125 are formed to have the same thickness as that of the sacrificial pattern 405 in accordance with the same procedure as in the manufacturing method described above. Then, as shown in FIG. 7A, the seed layer 406 formed from a metal film made of Au/Ti is formed on the surface of the sacrificial pattern 405 including the surfaces of the metal patterns 125. The seed layer 406 is formed from, e.g., a 0.1-$\mu$m thick Ti layer and a 0.1-$\mu$m thick Au layer formed on the Ti layer.

Figure 7B:
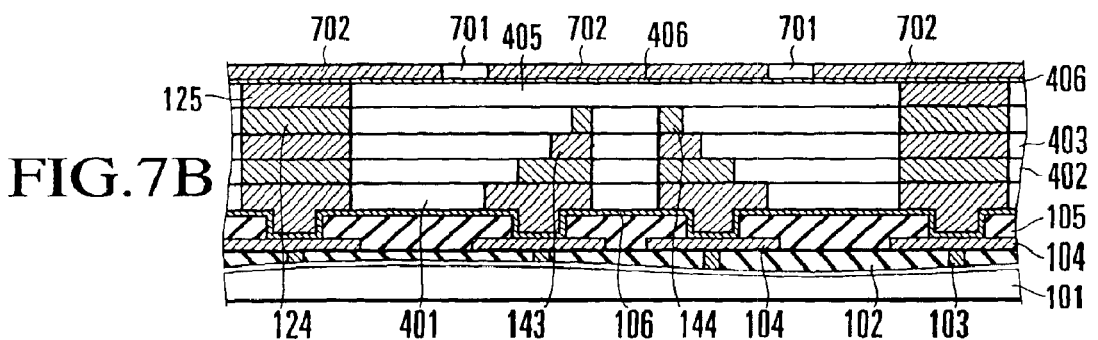
Figure 7C:
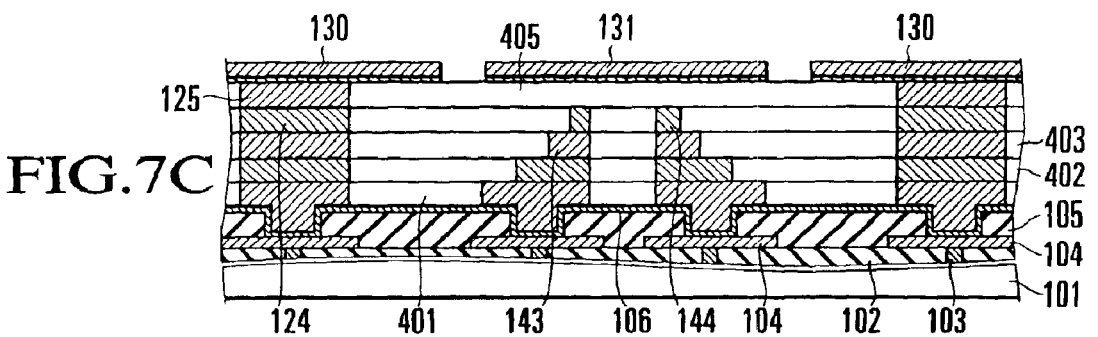

When the seed layer 406 is formed, a resist pattern 701 is formed. Next, as shown in FIG. 7B, a 1-$\mu$m thick metal film 702 made of Au is formed by electroplating on the seed layer 406 which is exposed outside the formation region of the resist pattern 701. After the resist pattern 701 is removed, the seed layer 406 is selectively removed using the metal film 702 as a mask to form the frame portion 130 and mirror portion 131, as shown in FIG. 7C.

The mirror portion 131 is fixed to the frame portion 130 by connection portions which act like torsion springs. The connection portions are formed from the metal film 702 and seed layer 406 which are not covered with the resist pattern 701 between the frame portion 130 and the mirror portion 131.

Figure 7D:
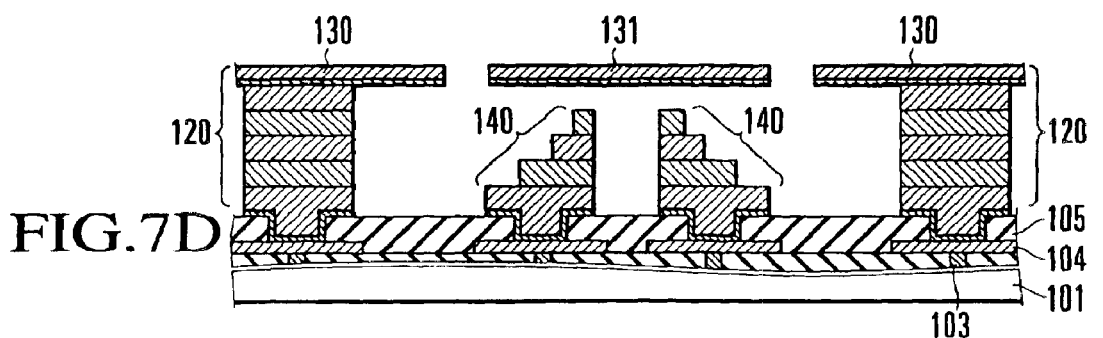

When the frame portion 130 and mirror portion 131 are formed, the sacrificial patterns 401, 402, 403, 404, and 405 are ashed using, e.g., an ozone asher through the opening portions between the frame portion 130 and the mirror portion 131. After that, the seed layer 106 is selectively removed using the metal patterns 121 and 141 as a mask. With this process, as shown in FIG. 7D, the support member 120 and control electrode portion 140 are formed under the frame portion 130 and mirror portion 131. The mirror portion 131 is arranged above the control electrode portion 140 while separated from the control electrode portion 140 by a predetermined distance.

As described above, even in the manufacturing method described with reference to FIGS. 7A to 7D, an active circuit for driving and controlling a mirror is formed on the lower electrode substrate in advance. After that, as described above, conductive patterns are stacked to form a control electrode portion and support member. A frame portion and mirror portion are formed on the support member to manufacture an optical switch device. As a result, according to this manufacturing method, the optical switch device can be made compact, and a high-performance optical switch device can be obtained.

In this manufacturing method, since the frame portion and mirror portion are formed from one metal film, the bonding step can be omitted. This is an advantage for manufacturing. Those who are skilled in the art can easily anticipate that, to prevent warp of a metal mirror due to stress, a mirror with controlled stress can be formed by stacking a number of metal layers which have different stress characteristics and can be plated can be manufactured.

Figure 8A:
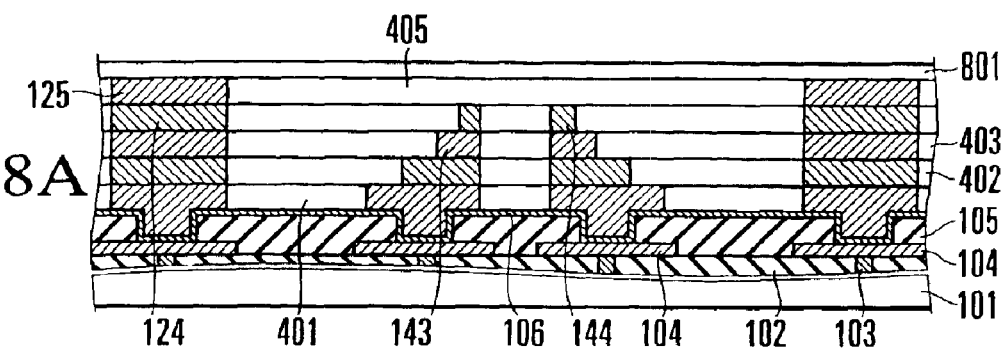
FIGS. 8A to 8D are sectional views for explaining still another method of manufacturing the optical switch device.

Still another manufacturing method will be described next. This manufacturing method also employs the same steps as those described with reference to FIGS. 3A to 5A in the above manufacturing method, and a description thereof will be omitted. In this manufacturing method, the metal patterns 125 are formed to have the same thickness as that of the sacrificial pattern 405 in accordance with the same procedure as in the manufacturing method described above. Then, as shown in FIG. 8A, a thin film 801 made of polysilicon and having a thickness of 1 μm is formed on the surface of the sacrificial pattern 405 including the surfaces of the metal patterns 125 at a relatively low temperature using ECRCVD capable of depositing a thin film.

Figure 8B:
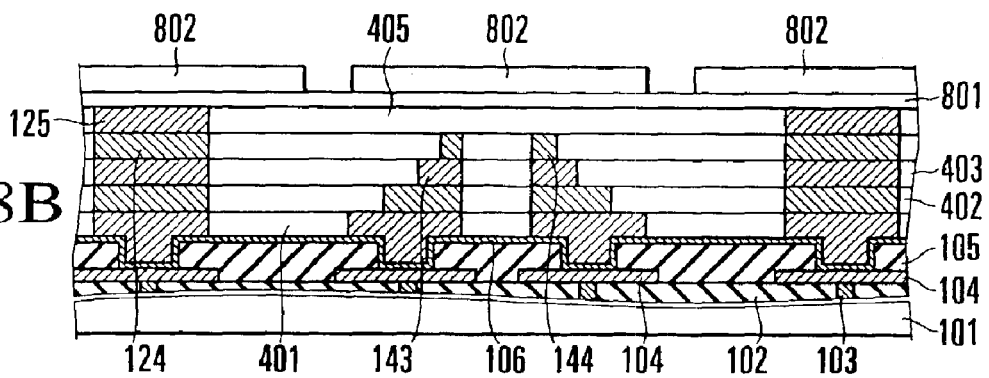
Figure 8C:
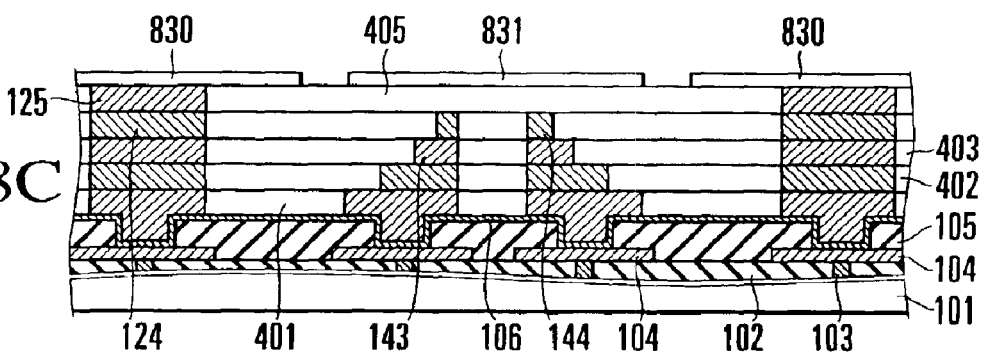

When the thin film 801 is formed, a resist pattern 802 is formed, as shown in FIG. 8B. Next, the thin film 801 is selectively removed by etching through the opening portions of the resist pattern 802. The resist pattern 802 is removed, thereby forming a frame portion 830 and mirror portion 831, as shown in FIG. 8C.

Figure 8D:
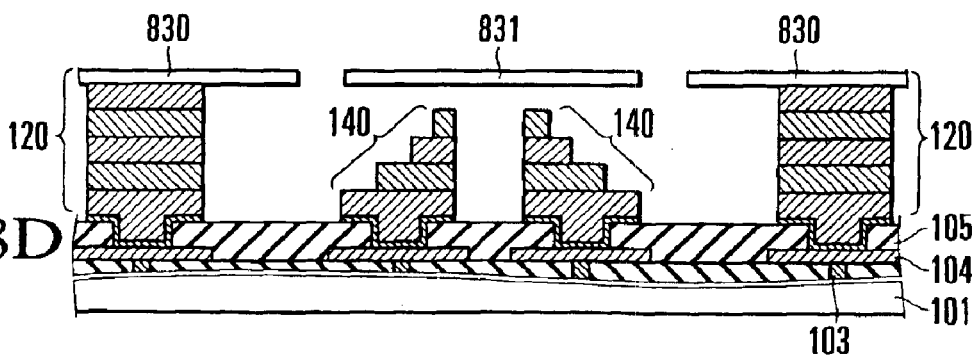
Figure 9:
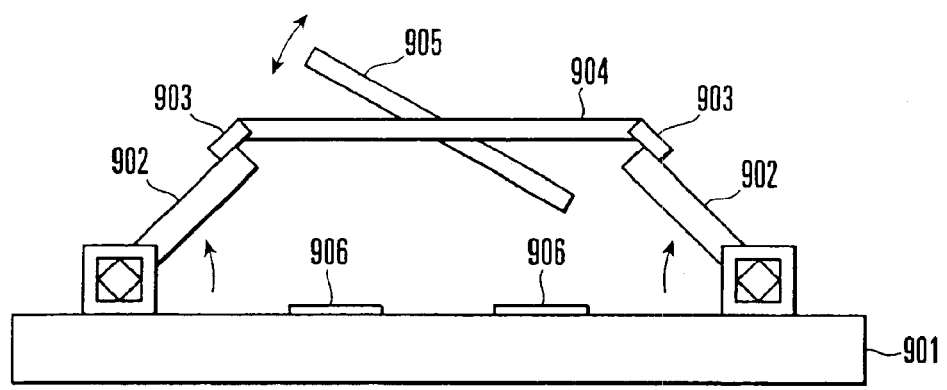
FIG. 9 is a side view showing the schematic arrangement of a conventional optical switch device.
Figure 10A:
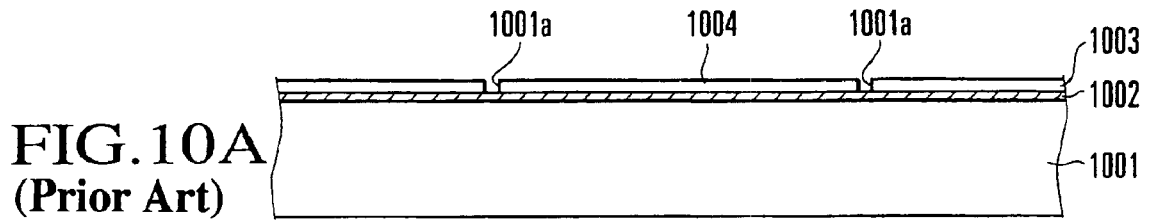
FIGS. 10A to 10F are sectional views schematically showing steps in manufacturing the conventional optical switch device.
Figure 10B:
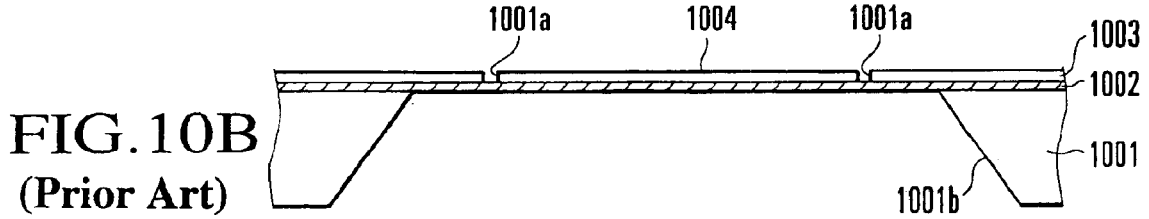
Figure 10C:
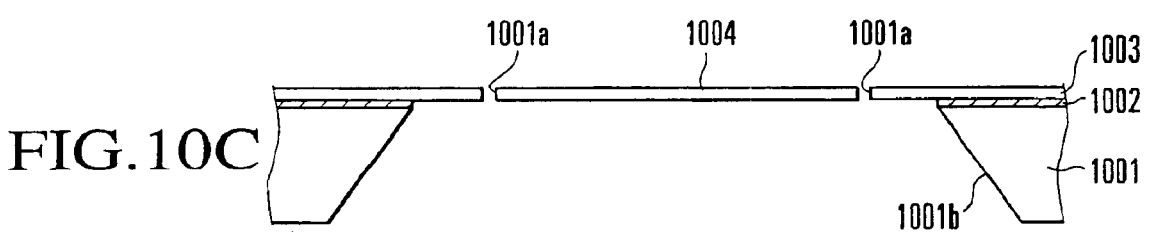
Figure 10D:
Figure 10E:
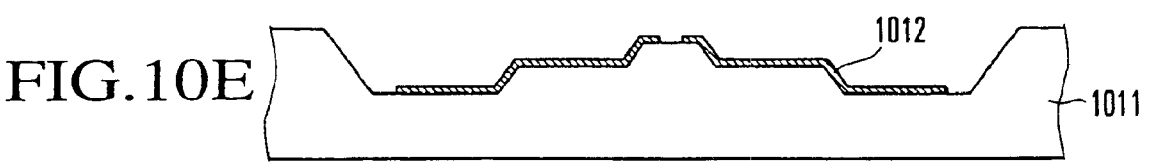
Figure 10F:
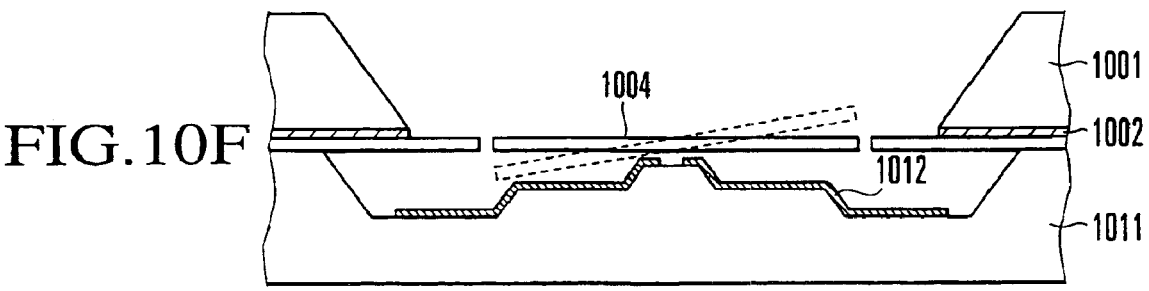

When the frame portion 830 and mirror portion 831 are formed, the sacrificial patterns 401, 402, 403, 404, and 405 are ashed using, e.g., an ozone asher through the opening portions between the frame portion 830 and the mirror portion 831. After that, the seed layer 106 is selectively removed using the metal patterns 121 and 141 as a mask. With this process, as shown in FIG. 8D, the support member 120 and control electrode portion 140 are formed under the frame portion 830 and mirror substrate 831. The mirror portion 831 is arranged above the control electrode portion 140 while separated from the control electrode portion 140 by a predetermined distance.

The mirror portion 831 is fixed to the frame portion 830 by connection portions (not shown) which act like torsion springs. The connection portions are formed from the thin film 801 under the opening portions of the resist pattern 802 between the frame portion 830 and the mirror portion 831.

As described above, even in the manufacturing method described with reference to FIGS. 8A to 8D, an active circuit for driving and controlling a mirror is formed on the lower electrode substrate in advance. After that, as described above, a control electrode portion and support member are formed. A frame portion and mirror portion are formed on the support member to manufacture an optical switch device. As a result, according to this manufacturing method, the optical switch device can be made compact, and a high-performance optical switch device can be obtained. In this manufacturing method, since the mirror is formed without bonding, the bonding step can be omitted. This is an advantage for manufacturing.

An example in which the support member 120 and control electrode portion 140 are formed by copper plating has been described above. However, the support member 120 and control electrode portion 140 may be formed by plating a metal such as gold that can be plated.

As has been described above, according to the present invention, a mirror element which has a movable portion which includes a reflecting surface and whose operation is controlled by a driving control circuit and a fixed support member which supports the movable portion is formed on a semiconductor substrate having an integrated circuit, including the driving control circuit, formed thereon. As a result, according to the present invention, a finer optical switch device can be manufactured more easily than before while suppressing any decrease in degree of integration or yield.

What is claimed is:

1. An optical switch device comprising:
an optical switch element constituted by
a fixed electrode portion arranged, via a dielectric layer, on a semiconductor substrate on which an integrated circuit is formed,
a mirror structure having a plate-shaped movable portion arranged above said fixed electrode portion while opposing said fixed electrode portion,
a reflecting portion which is formed at least at part of said movable portion to reflect light,
a support member which is fixed around said fixed electrode portion on the semiconductor substrate via a dielectric layer and supports said mirror structure; and
a driving control circuit which is incorporated in the integrated circuit to drive said optical switch element by applying a predetermined potential to said movable portion and said fixed electrode portion, wherein
said support member is formed from a plurality of stacked structures,
said support member is formed from a first structure formed on the semiconductor substrate via the dielectric layer and a second structure stacked on the first structure,
said fixed electrode portion is formed to be lower than said support member at least by a thickness of the second structure, said support member is formed from a first structure formed on the semiconductor substrate via the dielectric layer, a second structure stacked on the first structure, and a third structure stacked on the second structure, and said fixed electrode portion includes a fourth structure formed on the semiconductor substrate via the dielectric layer and having the same thickness as that of the first structure and a fifth structure stacked on the fourth structure and having the same thickness as that of the second structure and is formed to be lower than said support member at least by a thickness of the third structure.

2. A device according to claim 1, wherein said fixed electrode portion is tapered toward a central portion of said movable portion as a distance to said mirror structure decreases.

3. A device according to claim 1, wherein said fixed electrode portion is formed from a plurality of electrodes which are arranged symmetrically with respect to a normal to a surface of the semiconductor substrate, which passes through a central portion of said movable portion, and an outer side surface of each of the electrodes of an opposite side of the normal is formed to incline toward the central portion of said movable portion.

* * * * *